United States Patent
Li et al.

(10) Patent No.: US 11,081,535 B2
(45) Date of Patent: Aug. 3, 2021

(54) DISPLAY PANEL, METHOD FOR MANUFACTURING THE SAME, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Wenbo Li, Beijing (CN); Kairan Liu, Beijing (CN); Yingyi Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/689,728

(22) Filed: Nov. 20, 2019

(65) Prior Publication Data

US 2020/0258954 A1   Aug. 13, 2020

(30) Foreign Application Priority Data

Feb. 12, 2019 (CN) .......................... 201910111206.4

(51) Int. Cl.
*H01L 27/32* (2006.01)
*H01L 51/52* (2006.01)
*H01L 25/16* (2006.01)

(52) U.S. Cl.
CPC ........ *H01L 27/3227* (2013.01); *H01L 25/167* (2013.01); *H01L 27/3246* (2013.01); *H01L 51/5225* (2013.01); *H01L 2227/323* (2013.01)

(58) Field of Classification Search
CPC ............. H01L 27/3227; H01L 27/3246; H01L 25/167; H01L 51/5225
See application file for complete search history.

(56) References Cited

U.S. PATENT DOCUMENTS

| 2012/0061689 | A1* | 3/2012 | Yan ................... H01L 31/03928 257/84 |
| 2013/0048047 | A1* | 2/2013 | Fujii ................... H01L 31/0504 136/244 |
| 2013/0105823 | A1* | 5/2013 | Kurokawa ............. H04N 1/195 257/84 |
| 2014/0225090 | A1* | 8/2014 | Lee ........................ H01L 51/56 257/40 |

(Continued)

FOREIGN PATENT DOCUMENTS

| CN | 104793812 A | 7/2015 |
| CN | 107017280 A | 8/2017 |
| CN | 108878492 A | 11/2018 |

OTHER PUBLICATIONS

First Office Action dated Jun. 8, 2020 for corresponding Chinese application 201910111206.4.

*Primary Examiner* — Christine A Enad
(74) *Attorney, Agent, or Firm* — Nath, Goldberg & Meyer; Joshua B. Goldberg

(57) ABSTRACT

The present disclosure provides a display panel, a method for manufacturing the same, and a display device. The display panel includes a power supply, and includes a display area and a non-display area. A solar cell is disposed in the non-display area and is configured to convert external light into electric energy when the external light is irradiated on the solar cell, and charge the power supply with the converted electric energy.

6 Claims, 7 Drawing Sheets

(56) References Cited

U.S. PATENT DOCUMENTS

| | | | |
|---|---|---|---|
| 2015/0179985 A1* | 6/2015 | Chaudhari | H01L 51/5296 257/40 |
| 2016/0118446 A1 | 4/2016 | Im et al. | |
| 2017/0117495 A1* | 4/2017 | Chaudhari | H01L 51/4213 |
| 2017/0154927 A1* | 6/2017 | Jo | H01L 51/447 |
| 2018/0226526 A1* | 8/2018 | Ahn | H01L 31/0336 |
| 2019/0036047 A1* | 1/2019 | Zhou | H01L 51/0096 |
| 2020/0013974 A1* | 1/2020 | Fukumoto | H01L 51/448 |

* cited by examiner

DISPLAY PANEL, METHOD FOR MANUFACTURING THE SAME, AND DISPLAY DEVICE

CROSS-REFERENCE TO RELATED APPLICATIONS

This application claims priority from Chinese patent application No. 201910111206.4 filed on Feb. 12, 2019, the entirety of which is incorporated herein by reference.

TECHNICAL FIELD

The present disclosure belongs to the field of display technology, and particularly relates to a display panel, a method for manufacturing the same, and a display device.

BACKGROUND

An organic light emitting diode (OLED) display is a kind of self-luminous display, and is thinner and lighter than a liquid crystal display (LCD) because the OLED Display does not need a backlight. In addition, the OLED display is increasingly used in various high-performance display fields due to its advantages such as a high luminance, a wide viewing angle, a high response speed, a wide operating temperature range, and the like.

However, the OLED display is typically an electroluminescent device and displays by exciting electroluminescent material therein with electric energy. Therefore, existing OLED displays have strong dependence on power supply, that is, the power supply greatly limits the use of OLED displays and thus makes the use of OLED displays inconvenient.

SUMMARY

The present disclosure provides a display panel including a power supply, and including a display area and a non-display area. A solar cell is disposed in the non-display area and is configured to convert external light into electric energy when the external light is irradiated on the solar cell, and charge the power supply with the converted electric energy.

In some embodiments, the display panel includes: a substrate, and a pixel defining layer, a plurality of OLED devices, and the solar cell disposed on the substrate; each of the OLED devices includes a first OLED electrode, a light emitting layer and a second OLED electrode sequentially arranged on the substrate; and the pixel defining layer includes a plurality of first receiving parts each provided with the light emitting layer of one of the OLED devices therein, and a second receiving part located in the non-display area and provided with at least a photovoltaic conversion layer of the solar cell therein.

In some embodiments, the second OLED electrode has an opening, and the opening overlaps the second receiving part of the pixel defining layer when viewed from a direction perpendicular to an extending direction of the substrate.

In some embodiments, the solar cell includes a first solar cell electrode, the photovoltaic conversion layer, and a second solar cell electrode sequentially arranged on the substrate; and the second solar cell electrode is disposed in the same layer as the second OLED electrode and the second solar cell electrode and the second OLED electrode are formed as an integral structure, the photovoltaic conversion layer is disposed in the same layer as the light emitting layer, and the first solar cell electrode is disposed in the same layer and formed of the same material as the first OLED electrode.

In some embodiments, the display panel includes: a substrate, a plurality of OLED devices and an encapsulation layer sequentially disposed on the substrate, and the solar cell disposed at a side of the encapsulation layer distal to the plurality of OLED devices; and the solar cell is disposed between any two adjacent OLED devices when viewed from a direction perpendicular to an extending direction of the substrate.

In some embodiments, a second substrate is disposed at a side of the solar cell distal to the encapsulation layer.

In some embodiments, the display panel includes: a substrate, a thin film transistor and an insulating layer sequentially arranged on the substrate, a plurality of OLED devices and a pixel defining layer arranged at a side of the insulating layer distal to the substrate, and an encapsulation layer covering the plurality of OLED devices and the pixel defining layer. Each of the OLED devices includes a first OLED electrode, a light emitting layer and a second OLED electrode arranged sequentially distal to the substrate. The display panel further includes the solar cell disposed on the substrate. The solar cell is located between the substrate and the insulating layer. A gate of the thin film transistor is disposed in the same layer as a first solar cell electrode of the solar cell, an active layer of the thin film transistor is disposed in the same layer as a photovoltaic conversion layer of the solar cell, and a drain and a source of the thin film transistor are disposed in the same layer as a second solar cell electrode of the solar cell. The pixel defining layer includes a plurality of first receiving parts each provided with the light emitting layer of one of the OLED devices therein.

In some embodiments, a photovoltaic conversion layer of the solar cell includes perovskite and/or amorphous silicon.

In some embodiments, each of first and second solar cell electrodes of the solar cell includes at least one of nano-silver, graphene, carbon nanotubes, aluminum, cadmium, and copper.

The present disclosure provides a method for manufacturing a display panel including a power supply and including a display area and a non-display area; the method including: forming a solar cell in the non-display area of the display panel. The solar cell is configured to convert external light into electric energy when the external light is irradiated on the solar cell, and charge the power supply with the converted electric energy.

In some embodiments, the method further includes: forming a pixel defining layer on a substrate, and forming a plurality of first receiving parts and a second receiving part in the pixel defining layer; forming a light emitting layer of an OLED device in each of the first receiving parts; and forming a second OLED electrode of the OLED device at a side of the light emitting layer distal to the substrate. The second receiving part is located in the non-display area, and at least a photovoltaic conversion layer of the solar cell is formed in the second receiving part.

In some embodiments, after forming a second OLED electrode of the OLED device at a side of the light emitting layer distal to the substrate, the method further includes: patterning the second OLED electrode to provide an opening in the patterned second OLED electrode. The opening overlaps the second receiving part of the pixel defining layer when viewed from a direction perpendicular to an extending direction of the substrate.

In some embodiments, before forming a pixel defining layer on a substrate, the method further includes: forming a first OLED electrode of the OLED device and a first solar cell electrode of the solar cell on the substrate.

In some embodiments, after forming a plurality of first receiving parts and a second receiving part in the pixel defining layer and before forming a light emitting layer of an OLED device in each of the first receiving parts, the method further includes: forming the photovoltaic conversion layer and a second solar cell electrode of the solar cell sequentially in the second receiving part.

In some embodiments, the method further includes: forming a plurality of OLED devices and an encapsulation layer sequentially on a substrate. The solar cell is formed at a side of the encapsulation layer distal to the OLED devices, and formed between any two adjacent OLED devices when viewed from a direction perpendicular to an extending direction of the substrate.

In some embodiments, forming a solar cell in the non-display area includes: forming a first solar cell electrode at a side of the encapsulation layer distal to the OLED devices; forming a photovoltaic conversion layer on the first solar cell electrode; and forming a second solar cell electrode on the photovoltaic conversion layer.

In some embodiments, the solar cell is formed at a temperature less than 100° C.

In some embodiments, forming a solar cell in the non-display area includes: forming an initial solar cell on a second substrate; patterning the initial solar cell to obtain the solar cell; forming sequentially a plurality of OLED devices and an encapsulation layer on a first substrate; and making the solar cell on the second substrate and the encapsulation layer on the first substrate opposite to each other, and bonding the solar cell to the encapsulation layer. The solar cell is formed between any two adjacent OLED devices when viewed from a direction perpendicular to an extending direction of the first substrate.

In some embodiments, forming an initial solar cell on a second substrate includes: forming a second solar cell electrode layer on the second substrate; forming a photovoltaic conversion layer on the second solar cell electrode layer; and forming a first solar cell electrode layer on the photovoltaic conversion layer.

The present disclosure provides a display device including the display panel as described above.

DETAILED DESCRIPTION

To improve understanding of the technical solution of the present disclosure for those skilled in the art, the present disclosure will be described in detail below with reference to accompanying drawings and specific embodiments.

Unless otherwise defined, terms used herein should be understood as general meaning understood by those having ordinary skills in the art to which the present disclosure pertains. The words "first", "second" and similar terms used herein do not denote order, quantity, importance, and the like, but are used merely for distinguishing different elements or components. The word "comprising" or "comprises" or the like means that the element or component preceding the word includes elements or components that appear after the word, but does not exclude other elements or components.

In an embodiment of the present disclosure, there is provided a display panel including a power supply, and including a display area and a non-display area. An OLED device for display is disposed in the display area, and the power supply is configured to supply power for the OLED device. A solar cell is disposed in the non-display area, and is configured to convert external light into electric energy when the external light is irradiated on the solar cell, and charge the power supply with the converted electric energy. It should be understood that the power supply included in the display panel according to embodiments of the present disclosure may be an energy storage component (e.g., a storage battery) that is rechargeable such as a lithium battery.

Since the non-display area of the display panel according to the embodiment of the present disclosure is provided with the solar cell that can charge the power supply electrically connected thereto in the display panel with the electric energy converted from the external light, it is possible to reduce dependence of the display panel according to the embodiment of the present disclosure on external power supply, which is equivalent to reducing power consumption of the display panel. Meanwhile, since the solar cell can absorb external light, in the display panel according to the embodiment of the present disclosure, it is not necessary to provide a polarizer for reducing the reflection of the display panel to external light on a light emitting side of the OLED device of the display panel.

Figure 1:
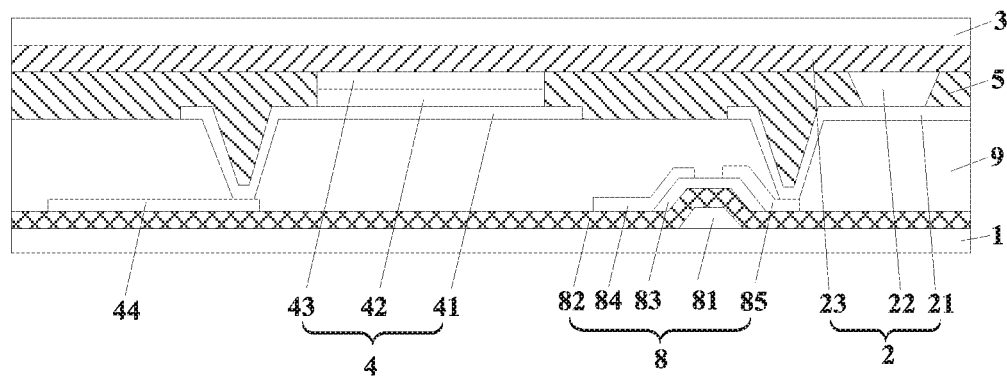
FIG. 1 is a cross-sectional view showing an example of an in-cell type touch display panel according to an embodiment of the present disclosure.
Figure 2:
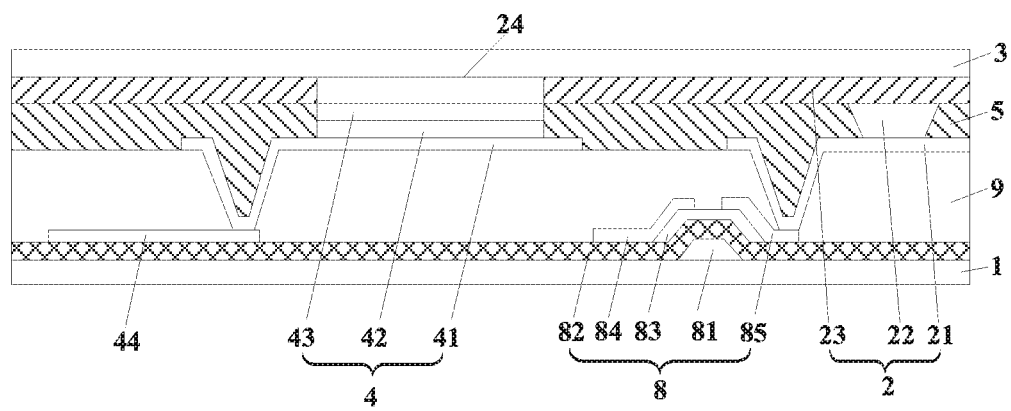
FIG. 2 is a cross-sectional view showing another example of an in-cell type touch display panel according to an embodiment of the present disclosure.
Figure 3:
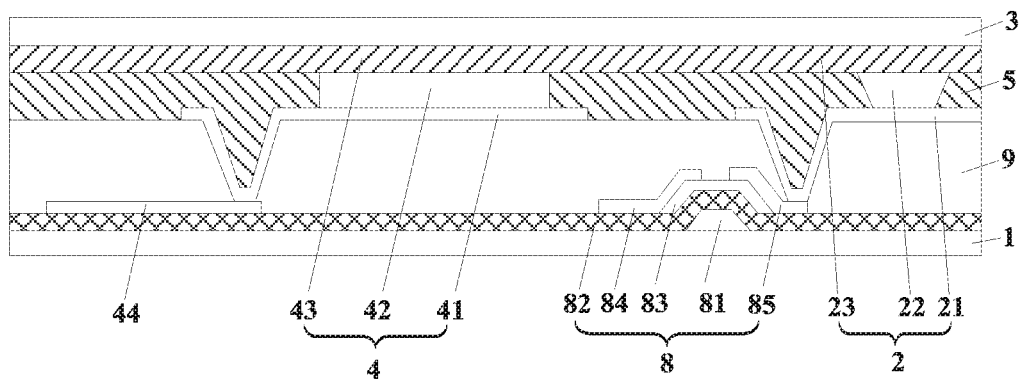
FIG. 3 is a cross-sectional view showing another example of an in-cell type touch display panel according to an embodiment of the present disclosure.

In some embodiments, the display panel may be implemented as an in-cell type touch display panel. FIG. 1 is a cross-sectional view showing an example of the in-cell type touch display panel according to an embodiment of the present disclosure. FIG. 2 is a cross-sectional view showing another example of the in-cell type touch display panel according to an embodiment of the present disclosure. FIG. 3 is a cross-sectional view showing another example of the in-cell type touch display panel according to an embodiment of the present disclosure.

As shown in FIG. 1, the in-cell type touch display panel according to an embodiment of the present disclosure may include: a substrate 1, a thin film transistor 8 and an insulating layer 9 sequentially arranged on the substrate 1, a plurality of OLED devices 2, a solar cell 4 and a pixel defining layer 5 arranged at a side of the insulating layer 9 distal to the substrate 1, and an encapsulation layer 3 covering the plurality of OLED devices 2, the solar cell 4 and the pixel defining layer 5. The plurality of OLED devices 2 may have different colors (i.e., emit light of different colors), and each of the OLED devices 2 includes a first OLED electrode 21, a light emitting layer 22, and a second OLED electrode 23 arranged sequentially distal to the substrate 1. The solar cell 4 includes a first solar cell electrode 41, a photovoltaic conversion layer (or photoelectric conversion layer) 42, and a second solar cell electrode 43 arranged sequentially distal to the substrate 1. The pixel defining layer 5 includes a plurality of first receiving parts each provided with the light emitting layer 22 of one of the OLED devices 2 therein, and a second receiving part located in the non-display area and provided with at least the photovoltaic conversion layer 42 of the solar cell 4 therein.

As shown in FIG. 1, the thin film transistor 8 includes a gate 81, a gate insulating layer 82, an active layer 83, a drain 84 and a source 85. As shown in FIG. 1, the in-cell type touch display panel further includes a solar cell signal line 44 disposed on the thin film transistor 8 and the first solar cell electrode 41 is electrically connected to the solar cell signal line 44. As shown in FIG. 1, the first OLED electrode 21 is electrically connected to the source 85 of the thin film transistor 8.

In some embodiments, as shown in FIG. 1, the second receiving part is provided with the photovoltaic conversion layer 42 and the second solar cell electrode 43 of the solar cell 4 therein. That is, the photovoltaic conversion layer 42 and the second solar cell electrode 43 of the solar cell 4, as well as the light emitting layer 22 of the OLED device 2, are all disposed in the receiving parts of the pixel defining layer 5. Namely, the light emitting layer 22 of each of the OLED devices 2 is disposed in a corresponding one of the first receiving parts of the pixel defining layer 5, while the photovoltaic conversion layer 42 and the second solar cell electrode 43 of the solar cell 4 are disposed in the second receiving part of the pixel defining layer 5. In this way, in the in-cell type touch display panel according to the embodiment of FIG. 1, the photovoltaic conversion layer 42 and the second solar cell electrode 43 of the solar cell 4 are disposed in the same layer as the light emitting layer 22 of the OLED device 2, thereby reducing the thickness of the in-cell type touch display panel and simplifying the manufacturing process of the in-cell type touch display panel.

In some embodiments, as shown in FIG. 2, an opening 24 is formed in the second OLED electrode 23 of the OLED device 2 and overlaps the second receiving part of the pixel defining layer 5 when viewed from a direction perpendicular to an extending direction of the substrate 1 (i.e., viewed from the vertical direction in FIG. 2).

In some embodiments, the second OLED electrode 23 of the OLED device 2 is a cathode layer of the OLED device 2. In this case, the cathode layer has the opening 24 at a position corresponding to the second receiving part so that the cathode layer does not cover the photovoltaic conversion layer 42 of the solar cell 4. As a result, the external light can be irradiated onto the photovoltaic conversion layer 42 of the solar cell 4 without being blocked by the cathode layer, thereby improving the photovoltaic conversion efficiency of the display panel having the solar cell 4.

In some embodiments, in order to further simplify the manufacturing process of the in-cell type touch display panel, the second solar cell electrode 43 of the solar cell 4 and the second OLED electrode 23 of the OLED device 2 share one electrode. For example, as shown in FIG. 3, the solar cell 4 includes a first solar cell electrode 41, a photovoltaic conversion layer 42, and a second solar cell electrode 43 arranged sequentially on the substrate 1, and the second solar cell electrode 43 is disposed in the same layer as the second OLED electrode 23 and the second solar cell electrode 43 and the second OLED electrode 23 are formed as an integral structure. In this case, moreover, the photovoltaic conversion layer 42 is disposed in the same layer as the light emitting layer 22, and the first solar cell electrode 41 is disposed in the same layer and formed of the same material as the first OLED electrode 21.

In some embodiments, the photovoltaic conversion layer 42 of the solar cell 4 may include perovskite and/or amorphous silicon, but the present disclosure is not limited thereto. For example, in some embodiments, the photovoltaic conversion layer 42 may include a multi-compound thin film material and/or organic material.

In some embodiments, each of the first solar cell electrode 41 and the second solar cell electrode 43 of the solar cell 4 may include at least one of nano-silver, graphene, carbon nanotubes, aluminum, cadmium, and copper, but the present disclosure is not limited thereto.

Figure 9:
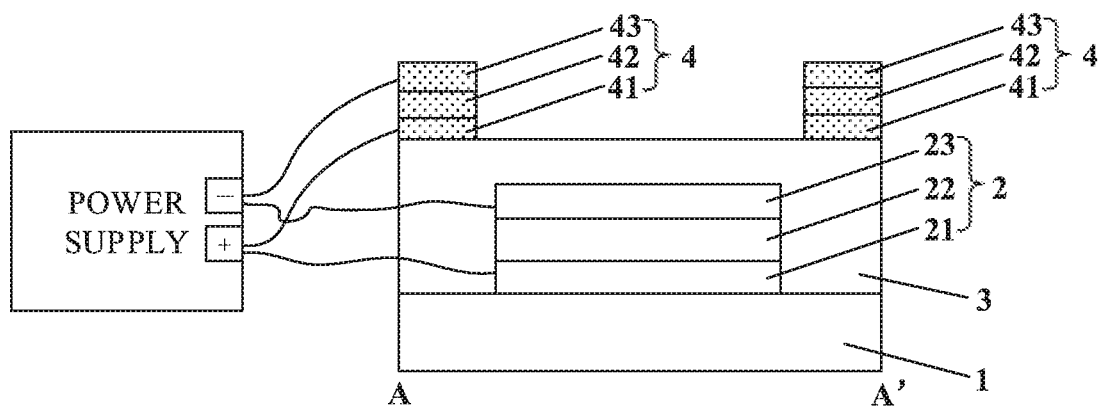
FIG. 9 is a cross-sectional view showing the on-cell type touch display panel of FIG. 8 taken along line A-A'.
Figure 13:
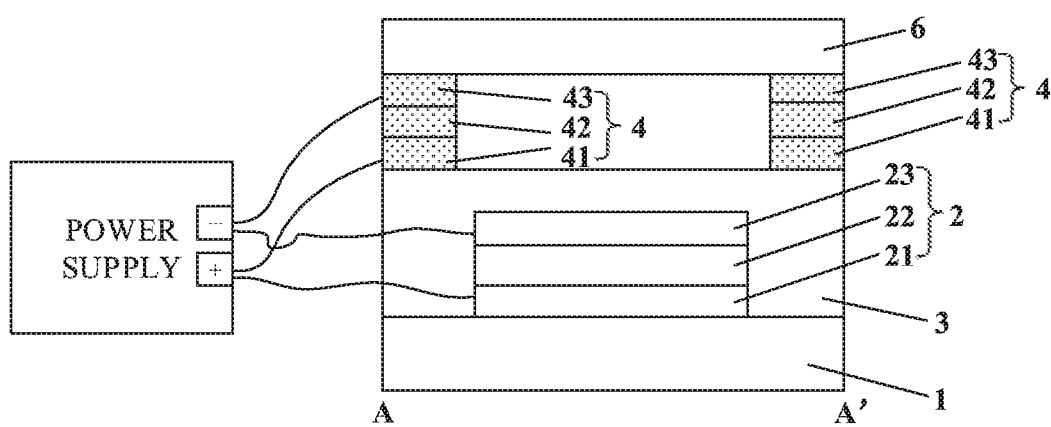
FIG. 13 is a cross-sectional view showing the out-cell type touch display panel of FIG. 12 taken along line B-B'.

Although not shown in FIGS. 1 to 3, it is to be understood that the first solar cell electrode 41 and the second solar cell electrode 43 of the solar cell 4 are electrically connected to the power supply of the in-cell type touch display panel to charge the power supply, and the power supply is electrically connected to the first OLED electrode 21 and the second OLED electrode 23 of the OLED device 2 to supply power for the OLED device 2 (as shown in FIGS. 9 and 13).

In an embodiment of the present disclosure, there is further provided a method for manufacturing a display panel, the method including: forming a solar cell in a non-display area of the display panel.

Figure 4:
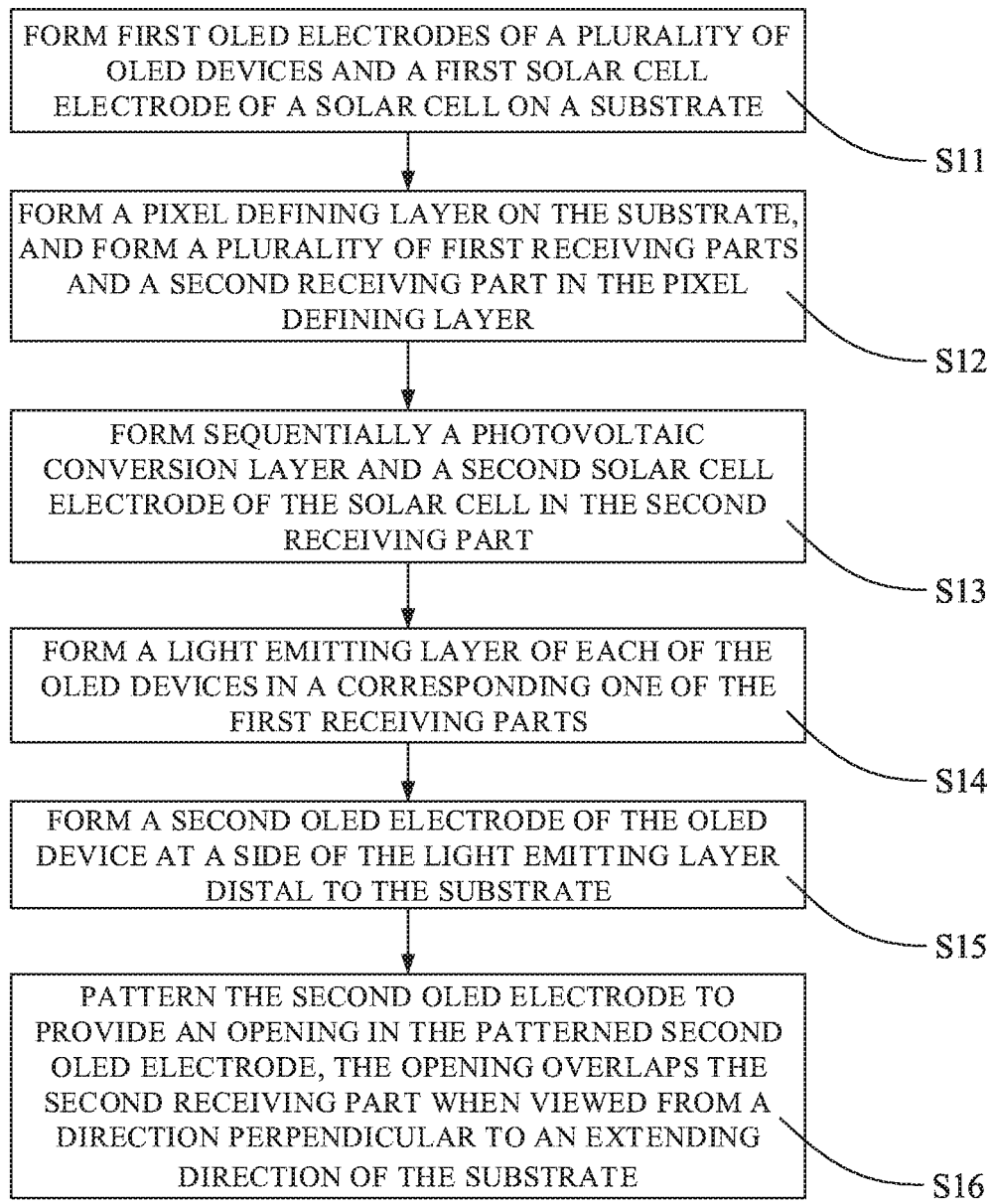
FIG. 4 exemplarily shows a method for manufacturing the in-cell type touch display panel of FIG. 2.

FIG. 4 exemplarily shows a method for manufacturing the in-cell type touch display panel of FIG. 2.

As shown in FIG. 4, the method for manufacturing the in-cell type touch display panel may include the following steps S11 to S16.

In step S11, first OLED electrodes 21 of a plurality of OLED devices 2 and a first solar cell electrode 41 of a solar cell 4 are formed on a substrate 1.

It should be understood that the plurality of OLED devices 2 herein may be OLED devices of different colors, such as red OLED devices R, green OLED devices G, blue OLED devices B, and the like.

In some embodiments, the step of forming the first OLED electrodes 21 of the plurality of OLED devices 2 and the first solar cell electrode 41 of the solar cell 4 on the substrate 1 may include: firstly, depositing a first OLED electrode layer and a first solar cell electrode layer on the substrate 1 by sputtering, PECVD (Plasma Enhanced Chemical Vapor Deposition), or coating; then, forming the first OLED electrodes 21 of the plurality of OLED devices 2 and the first solar cell electrode 41 of the solar cell 4 by patterning (e.g., wet etching) the first OLED electrode layer and the first solar cell electrode layer.

In step S12, a pixel defining layer 5 is formed on the substrate 1, and a plurality of first receiving parts and a second receiving part are formed in the pixel defining layer 5.

It should be noted that the plurality of first receiving parts are in one-to-one correspondence with the first OLED electrodes 21 of the plurality of OLED devices 2 formed in step S11, and each of the first receiving parts at least partially overlaps the corresponding first OLED electrode 21 when viewed from a direction perpendicular to an extending direction of the substrate 1. Further, the second receiving part at least partially overlaps the first solar cell electrode 41 formed in step S11 when viewed from the direction perpendicular to the extending direction of the substrate 1. Further, the second receiving part is located in the non-display area, and at least the photovoltaic conversion layer 42 of the solar cell 4 is formed in the second receiving part.

In step S13, a photovoltaic conversion layer 42 and a second solar cell electrode 43 of the solar cell 4 are formed sequentially in the second receiving part.

In some embodiments, the step S13 may include: forming the photovoltaic conversion layer 42 in the second receiving part by PECVD or spin coating, forming a second solar cell electrode layer in the photovoltaic conversion layer by sputtering, PECVD, or coating, and forming the second solar cell electrode 43 by patterning (e.g., wet etching) the second solar cell electrode layer.

In step S14, a light emitting layer 22 of each of the OLED devices 2 is formed in a corresponding one of the first receiving parts.

In some embodiments, the light emitting layer 22 may be formed in the corresponding first receiving part by an evaporation process. The light emitting layer 22 may be made of a known light emitting material for OLED devices.

In step S15, a second OLED electrode 23 of the OLED device 2 is formed at a side of the light emitting layer 22 distal to the substrate 1.

In step S16, the second OLED electrode 23 is patterned so that the patterned second OLED electrode 23 has an opening 24 at a position corresponding to the second receiving part. That is, the opening 24 is provided in the patterned second OLED electrode 23, and the opening 24 overlaps the second receiving part when viewed from a direction perpendicular to an extending direction of the substrate 1. In some embodiments, the opening 24 may be larger than the second receiving part, that is, when viewed from the direction perpendicular to the extending direction of the substrate 1, at least one edge of the opening 24 extends outward beyond a corresponding edge of the second receiving part so that the external light directly irradiates onto the solar cell 4 through the opening 24.

The manufacture of the OLED devices 2, the solar cell 4, and the pixel defining layer 5 of the in-cell type touch display panel is completed through the above steps S11 to S16. It should be understood that the method for manufacturing the in-cell type touch display panel may further include forming a thin film transistor 8, a solar cell signal line 44, an insulating layer 9, and an encapsulation layer 3 on the substrate 1, and the above steps S11 to S16 may be performed after the thin film transistor 8, the solar cell signal line 44, and the insulating layer 9 are formed and before forming the encapsulation layer 3. The thin film transistor 8, the solar cell signal line 44, the insulating layer 9, and the encapsulation layer 3 may be formed of any suitable material and with any suitable technique known to those of ordinary skills in the art, which will not be described in detail herein.

It should be understood that in the method for manufacturing the in-cell type touch display panel according to embodiments of the present disclosure, since the light emitting layers 22 and the second OLED electrodes 23 of the OLED devices 2 are formed after formation of the photovoltaic conversion layer 42 and the second solar cell electrode 43 of the solar cell 4, it is not necessary to limit the manufacturing temperature of the solar cell 4. That is, the performance of the OLED devices 2 will not be affected even if the solar cell 4 is manufactured at a high temperature.

Figure 5:
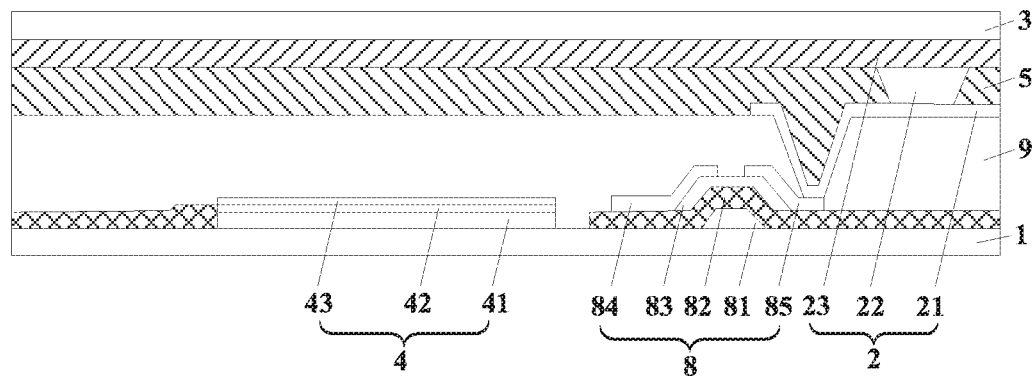
FIG. 5 is a cross-sectional view showing another example of an in-cell type touch display panel according to an embodiment of the present disclosure.
Figure 6:
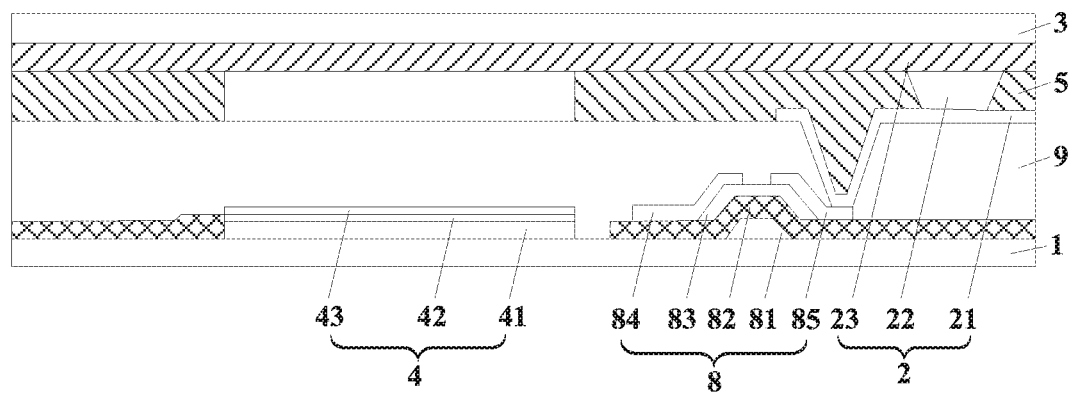
FIG. 6 is a cross-sectional view showing another example of an in-cell type touch display panel according to an embodiment of the present disclosure.
Figure 7:
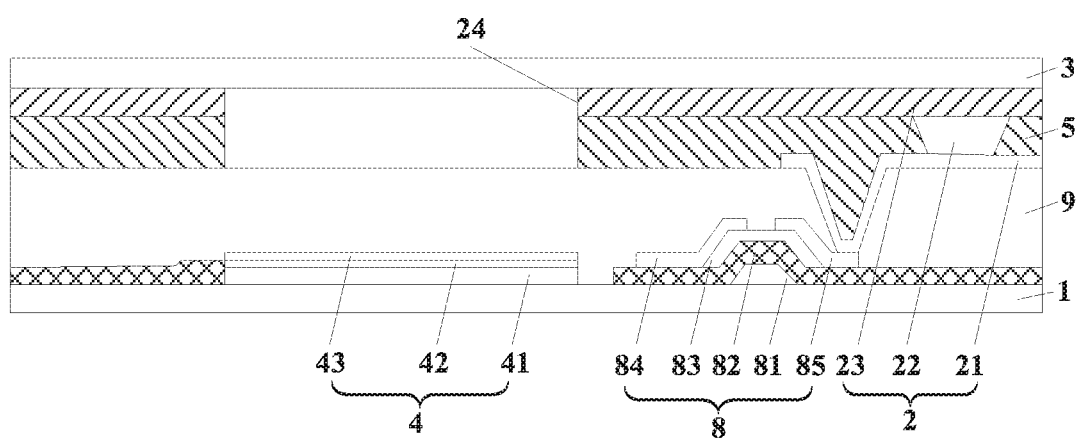
FIG. 7 is a cross-sectional view showing another example of an in-cell type touch display panel according to an embodiment of the present disclosure.

FIG. 5 is a cross-sectional view showing another example of an in-cell type touch display panel according to an embodiment of the present disclosure. FIG. 6 is a cross-sectional view showing another example of an in-cell type touch display panel according to an embodiment of the present disclosure. FIG. 7 is a cross-sectional view showing another example of an in-cell type touch display panel according to an embodiment of the present disclosure. For the sake of clarity, the description that has been made in accordance with FIGS. 1 to 3 will not be repeated.

In some embodiments, as shown in FIGS. 5 to 7, the solar cell 4 may be directly formed on the substrate 1 (i.e., the solar cell 4 is located between the substrate 1 and the insulating layer 9) by steps similar to the above steps S11 and S13. In this case, the active layer 83 of the thin film transistor 8 and the photovoltaic conversion layer 42 of the solar cell 4 may both be formed of a semiconductor material, and thus, the solar cell 4 and the thin film transistor 8 may be formed on the substrate 1 simultaneously. In this case, the gate 81 of the thin film transistor 8 is disposed in the same layer as the first solar cell electrode 41 of the solar cell 4, the active layer 83 of the thin film transistor 8 is disposed in the same layer as the photovoltaic conversion layer 42 of the solar cell 4, and the drain 84 and the source 85 of the thin film transistor 8 are disposed in the same layer as the second solar cell electrode 43 of the solar cell 4, so that a common mask can be used to pattern both the thin film transistor 8 and the solar cell 4 simultaneously, thereby simplifying the manufacture process of the in-cell type touch display panel and reducing the manufacture cost of the in-cell type touch display panel.

In some embodiments, as shown in FIG. 5, the pixel defining 5 layer may include the plurality of first receiving parts and not include the second receiving part.

Figure 8:
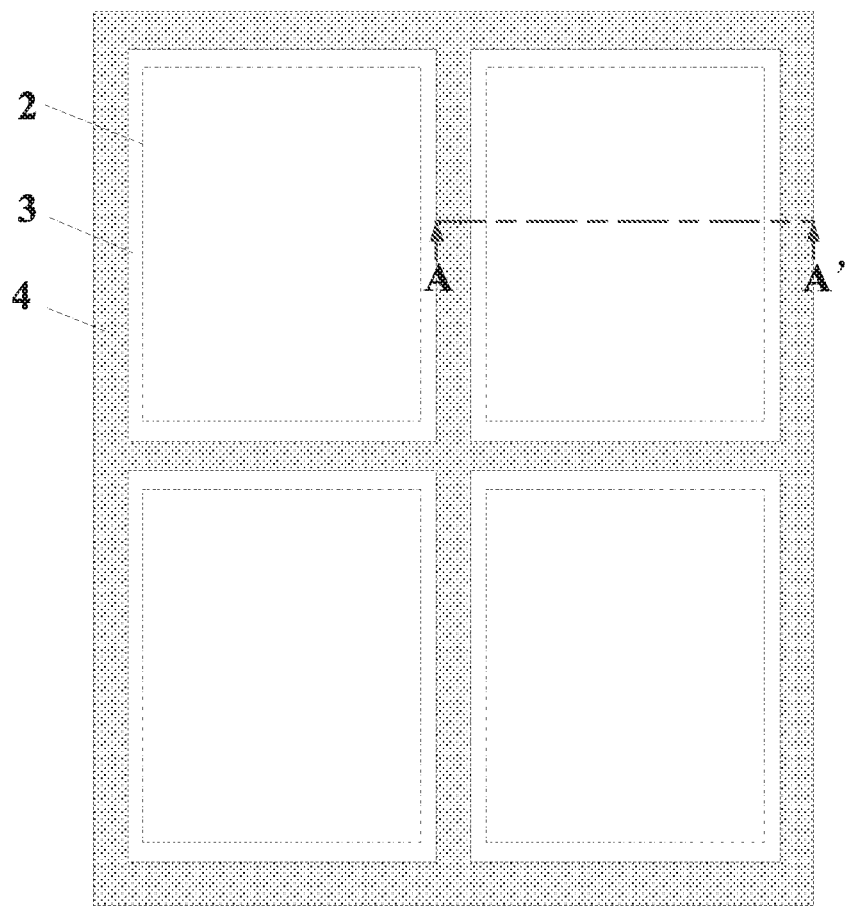
FIG. 8 is a partial plan view showing an example of an on-cell type touch display panel according to an embodiment of the present disclosure.

In some embodiments, the display panel may be implemented as an on-cell type touch display panel. FIG. 8 is a partial plan view showing an example of an on-cell type touch display panel according to an embodiment of the present disclosure. FIG. 9 is a cross-sectional view showing the on-cell type touch display panel of FIG. 8 taken along line A-A'. For the sake of clarity, the description that has been made in accordance with FIGS. 1 to 7 will not be repeated.

As shown in FIGS. 8 and 9, the on-cell type touch display panel according to an embodiment of the present disclosure may include: a substrate 1, a plurality of OLED devices 2 and an encapsulation layer 3 sequentially arranged on the substrate 1, and a solar cell 4 disposed at a side of the encapsulation layer 3 distal to the OLED devices 2. The plurality of OLED devices 2 may have different colors. In some embodiments, as shown in FIGS. 8 and 9, the solar cell 4 is disposed between any two adjacent OLED devices 2 when viewed from a direction perpendicular to an extending direction of the substrate 1.

In the on-cell type touch display panel according to the embodiment of the present disclosure, as shown in FIGS. 8 and 9, the solar cell 4 is directly disposed on the encapsulation layer 3, and as a result, the external light may be directly irradiated onto the solar cell 4 without being blocked by other parts such as the encapsulation layer 3, thereby improving the photovoltaic conversion efficiency of the display panel having the solar cell 4, and further reducing dependence of the display panel on the external power supply.

As shown in FIGS. 8 and 9, the first solar cell electrode 41 (e.g., the anode) and the second solar cell electrode 43 (e.g., the cathode) of the solar cell 4 are electrically connected to a positive electrode and a negative electrode of the power supply of the on-cell type touch display panel, respectively, so as to charge the power supply; and the positive and negative electrodes of the power supply are electrically connected to the first OLED electrode 21 (e.g., the anode) and the second OLED electrode 23 (e.g., the cathode) of each of the OLED devices 2, respectively, so as to supply power for the OLED devices 2.

Figure 10:
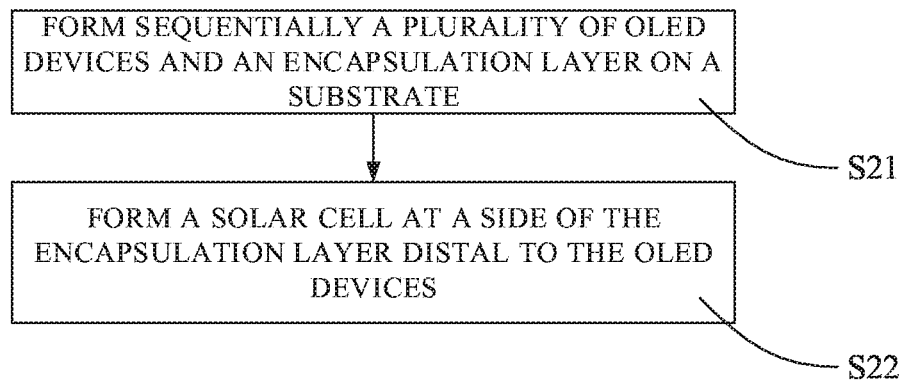
FIG. 10 exemplarily shows a method for manufacturing the on-cell type touch display panel of FIG. 8.

In an embodiment of the present disclosure, there is further provided a method for manufacturing the on-cell type touch display panel as described above. FIG. 10 exemplarily shows a method for manufacturing the on-cell type touch display panel of FIG. 8. For the sake of clarity, the description that has been made in accordance with FIG. 4 will not be repeated.

As shown in FIG. 10, the method for manufacturing the on-cell type touch display panel may include the following steps S21 to S22.

In step S21, a plurality of OLED devices 2 and an encapsulation layer 3 are formed sequentially on the substrate 1. It should be understood that the plurality of OLED devices 2 and the encapsulation layer 3 in step S21 may be formed with substantially the same method as that for manufacturing the plurality of OLED devices 2 and the encapsulation layers 3 in the above method for manufacturing the in-cell type touch display panel.

In step S22, a solar cell 4 is formed at a side of the encapsulation layer 3 distal to the OLED devices 2.

In some embodiments, as shown in FIGS. 8 and 9, the solar cell 4 is formed between any two adjacent OLED devices 2 when viewed from a direction perpendicular to an extending direction of the substrate 1.

It should be noted that in the case where the solar cell 4 is formed on the encapsulation layer 3 as described above, the temperature needs to be controlled under 100° C. during formation of the solar cell 4 to avoid damages of the formed OLED devices 2 due to a too high temperature.

Figure 11:
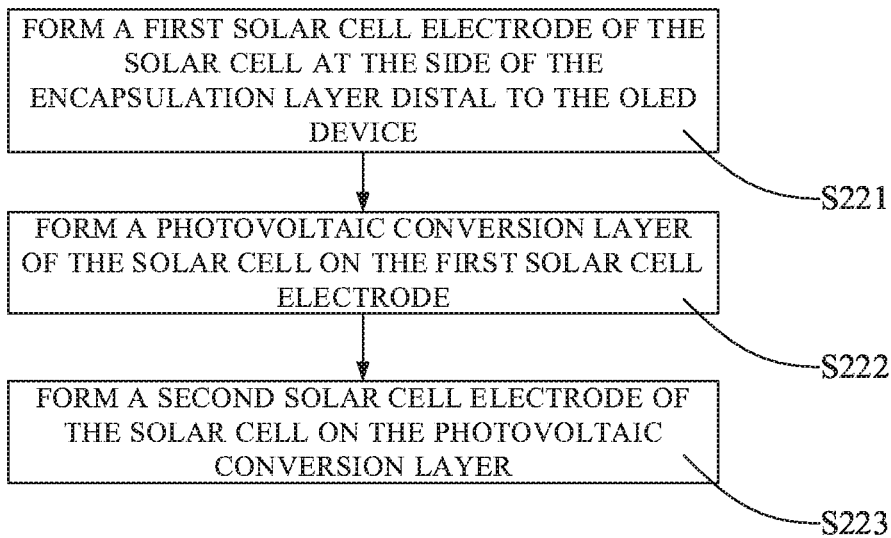
FIG. 11 is a flowchart showing the step of forming a solar cell at a side of the encapsulation layer distal to the OLED devices in the method of FIG. 10.

FIG. 11 is a flowchart showing the step of forming a solar cell at a side of the encapsulation layer distal to the OLED devices in the method of FIG. 10. In some embodiments, as shown in FIG. 11, the step S22 may further include the following steps S221 to S223.

In step S221, a first solar cell electrode 41 of the solar cell 4 is formed at the side of the encapsulation layer 3 distal to the OLED devices 2.

In some embodiments, a first solar cell electrode layer is firstly formed at the side of the encapsulation layer 3 distal to the OLED devices 2 by sputtering, PECVD, or coating, and then the first solar cell electrode 41 is formed by patterning (e.g., wet etching) the first solar cell electrode layer.

In step S222, a photovoltaic conversion layer 42 of the solar cell 4 is formed on the first solar cell electrode 41 formed in step S221.

In some embodiments, the photovoltaic conversion layer 42 of the solar cell 4 is formed on the first solar cell electrode 41 formed in step S221 by PECVD or spin coating.

In step S223, a second solar cell electrode 43 of the solar cell 4 is formed on the photovoltaic conversion layer 42 formed in step S222.

In some embodiments, the second solar cell electrode 43 in step S223 is formed with substantially the same method as that for forming the first solar cell electrode 41 in step S221.

Figure 12:
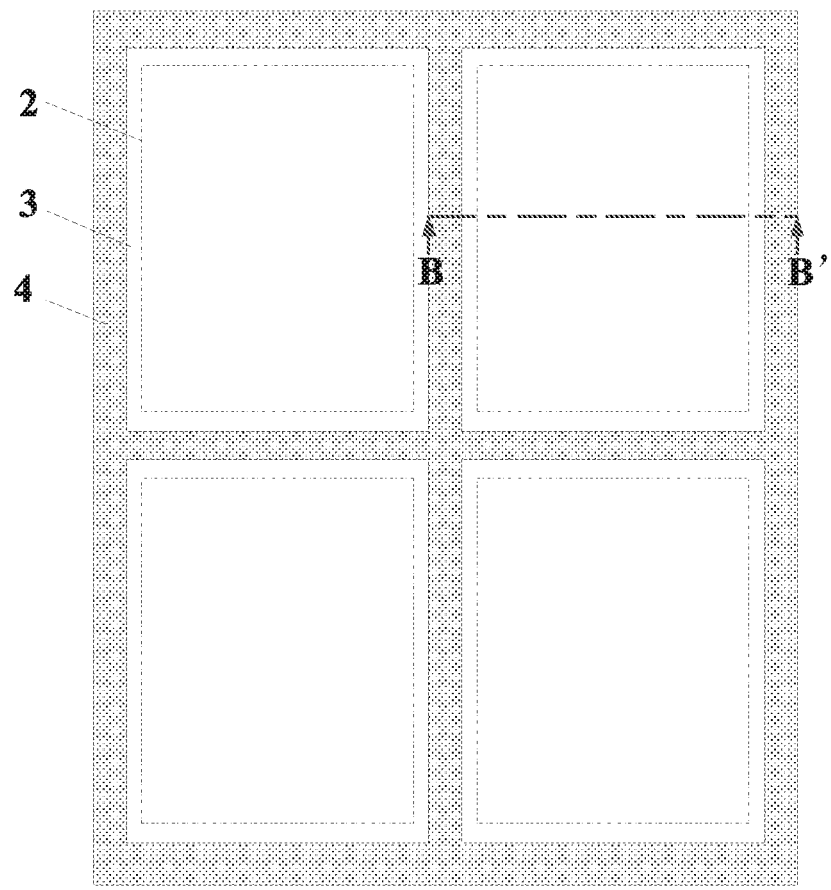
FIG. 12 is a partial plan view showing an example of an out-cell type touch display panel according to an embodiment of the present disclosure.

In some embodiments, the display panel may be implemented as an out-cell type touch display panel. FIG. 12 is a partial plan view showing an example of an out-cell type touch display panel according to an embodiment of the present disclosure. FIG. 13 is a cross-sectional view showing the out-cell type touch display panel of FIG. 12 taken along line B-B'. For the sake of clarity, the description that has been made in accordance with FIGS. 1 to 11 will not be repeated.

As shown in FIGS. 12 and 13, the out-cell type touch display panel according to the embodiment of the present disclosure is substantially the same in structure as the on-cell type touch display panel described above except that in the out-cell type touch display panel, a second substrate 6 is provided at a side of the solar cell 4 distal to the encapsulation layer 3. It should be understood that the second substrate 6 is not shown in FIG. 12 for clarity.

Figure 14:
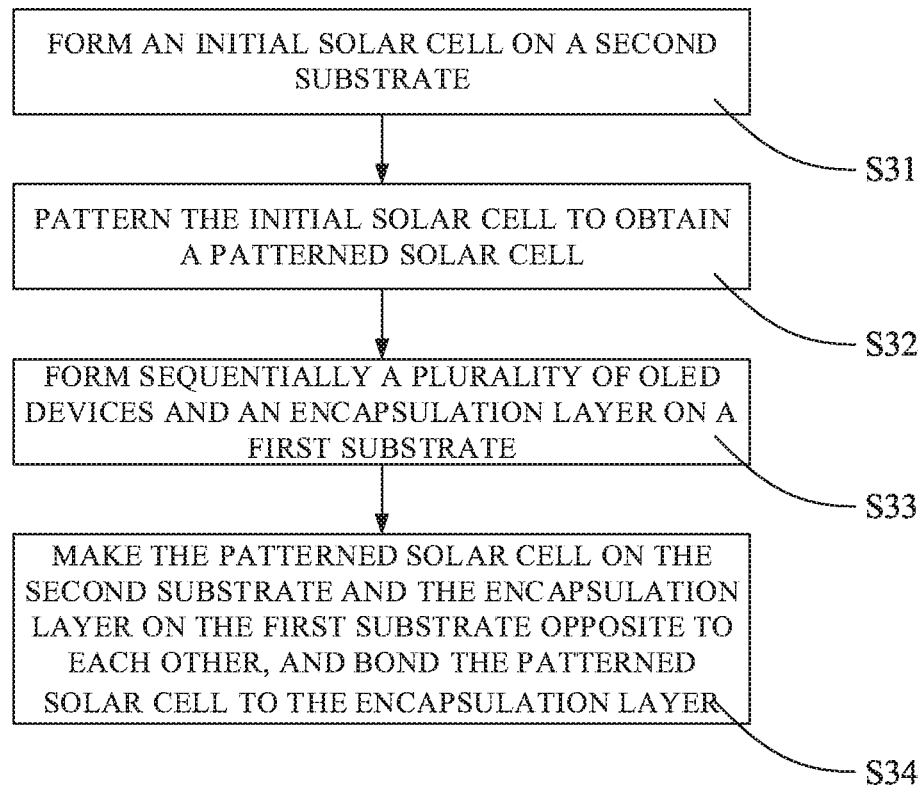
FIG. 14 exemplarily shows a method for manufacturing the out-cell type touch display panel of FIG. 12.

It should be noted that the method for manufacturing the out-cell type touch display panel is significantly different from the method for manufacturing the on-cell type touch display panel. FIG. 14 exemplarily shows a method for manufacturing the out-cell type touch display panel of FIGS. 12 and 13.

As shown in FIG. 14, the method for manufacturing the out-cell type touch display panel may include the following steps S31 to S34.

In step S31, a initial solar cell is formed on the second substrate 6.

In step S32, the initial solar cell is patterned to obtain a patterned solar cell 4.

In step S33, a plurality of OLED devices 2 and an encapsulation layer 3 are formed sequentially on a first substrate 1.

In step S34, the patterned solar cell 4 on the second substrate 6 and the encapsulation layer 3 on the first substrate 1 are made to opposite to each other and the patterned solar cell 4 is bonded to the encapsulation layer 3. In some embodiments, as shown in FIGS. 12 and 13, the patterned solar cell 4 is formed between any two adjacent OLED devices 2 when viewed from a direction perpendicular to an extending direction of the first substrate 1.

It should be understood that step S33 may be performed before sequentially performing steps S31, S32, and S34.

Figure 15:
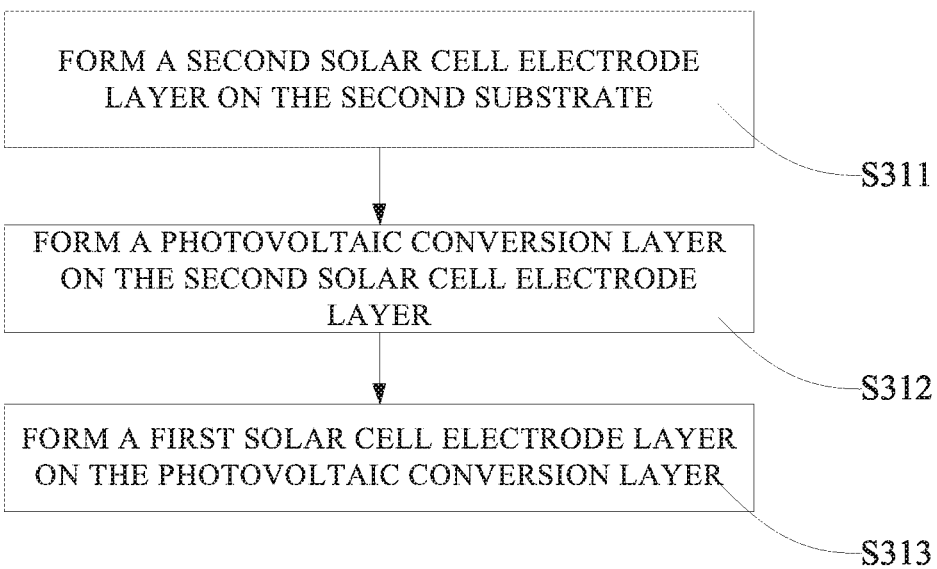
FIG. 15 is a flowchart showing the step of forming a solar cell on a second substrate in the method of FIG. 14.

FIG. 15 is a flowchart showing the step of forming the initial solar cell on the second substrate in the method of FIG. 14. In some embodiments, as shown in FIG. 15, the step S31 includes the following steps S311 to S313.

In step S311, a second solar cell electrode layer of the initial solar cell is formed on the second substrate 6.

In some embodiments, the second solar cell electrode layer of the initial solar cell is formed on the second substrate 6 by sputtering, PECVD, or coating.

In step S312, a photovoltaic conversion layer of the initial solar cell is formed on the second solar cell electrode layer formed in step S311.

In some embodiments, the photovoltaic conversion layer of the initial solar cell is formed on the second solar cell electrode layer formed in step S311 by PECVD or spin coating.

In step S313, a first solar cell electrode layer of the initial solar cell is formed on the photovoltaic conversion layer formed in step S312.

In some embodiments, the first solar cell electrode layer in step S313 is formed with substantially the same method as that for forming the second solar cell electrode layer in step S311.

It should be noted that, as shown in FIGS. 12 and 13, the first solar cell electrode 41 and the second solar cell electrode 43 of the solar cell 4 are electrically connected to the power supply of the out-cell type touch display panel to charge the power supply; and the power supply is electrically connected to the first OLED electrode 21 and the second OLED electrode 23 of the OLED device 2 to supply power for the OLED device 2.

It should be understood that, the accompanying drawings show only one thin film transistor 8 for the display panel according to embodiments of the present disclosure, but the present disclosure is not limited thereto. For example, a display panel according to embodiments of the present disclosure may include a plurality of thin film transistors 8, and the plurality of thin film transistors 8 and the plurality of OLED devices 2 may be in one-to-one correspondence. In this case, each of the OLED devices 2 may be electrically connected to a corresponding thin film transistor 8.

It should be understood that, for example, as shown in FIGS. 8 and 12, when viewed from the direction perpendicular to the extending direction of the substrate 1, the solar cell 4 of the in-cell, on-cell, and out-cell type display panels, which are manufactured by the above methods for manufacturing a display panel according to an embodiment of the present disclosure, may be an integral structure having a mesh shape and surrounding the plurality of OLED devices, which simplifies the manufacturing process of the solar cell 4 and provides a larger area for photovoltaic conversion.

In an embodiment of the present disclosure, there is further provided a display device including the display panel according to any of the embodiments disclosed herein. Since the display device according to the embodiment of the present disclosure includes the above-described display panel, it can reduce the dependence on the external power supply.

The display device according to the embodiment of the present disclosure may include any product or component having a display function, such as a mobile phone, a tablet, a television, a monitor, a notebook computer, a digital album, a navigator, or the like.

It should be understood that the above embodiments are merely exemplary embodiments for the purpose of illustrating the principle of the disclosure, and the disclosure is not limited thereto. Various modifications and improvements can be made by those ordinary skilled persons in the art without departing from the spirit and essence of the disclosure. Accordingly, all of the modifications and improvements also fall into the protection scope of the disclosure.

What is claimed is:

1. A method for manufacturing a display panel,
the display panel comprising a power supply, and comprising a display area and a non-display area;
the method comprising: forming a solar cell in the non-display area of the display panel, wherein the solar cell is configured to convert external light into electric energy when the external light is irradiated on the solar cell, and charge the power supply with the converted electric energy;
wherein forming a solar cell in the non-display area comprises:
forming an initial solar cell on a second substrate;
patterning the initial solar cell to obtain the solar cell;
forming sequentially a plurality of OLED devices and an encapsulation layer on a first substrate; and
making the solar cell on the second substrate and the encapsulation layer on the first substrate opposite to each other, and bonding the solar cell to the encapsulation layer,
wherein the solar cell is formed between any two adjacent OLED devices when viewed from a direction perpendicular to an extending direction of the first substrate.

2. The method according to claim 1, wherein forming an initial solar cell on a second substrate comprises:
forming a second solar cell electrode layer on the second substrate;
forming a photovoltaic conversion layer on the second solar cell electrode layer; and
forming a first solar cell electrode layer on the photovoltaic conversion layer.

3. A display panel comprising a power supply, and comprising a display area and a non-display area, wherein
a solar cell is disposed in the non-display area, and the solar cell is configured to convert external light into electric energy when the external light is irradiated on the solar cell, and charge the power supply with the converted electric energy;
the display panel comprises: a substrate, and a pixel defining layer, a plurality of OLED devices, and the solar cell disposed on the substrate;
each of the OLED devices comprises a first OLED electrode, a light emitting layer and a second OLED electrode sequentially arranged on the substrate;
the pixel defining layer comprises a plurality of first receiving parts each provided with the light emitting layer of one of the OLED devices therein, and a second receiving part located in the non-display area and provided with at least a photovoltaic conversion layer of the solar cell therein; and
the solar cell comprises a first solar cell electrode, the photovoltaic conversion layer, and a second solar cell electrode sequentially arranged on the substrate, the second solar cell electrode is disposed in the same layer as the second OLED electrode and the second solar cell electrode and the second OLED electrode are formed as an integral structure, the photovoltaic conversion layer is disposed in the same layer as the light emitting layer, and the first solar cell electrode is disposed in the same layer and formed of the same material as the first OLED electrode.

4. The display panel according to claim 3, wherein the photovoltaic conversion layer of the solar cell comprises perovskite and/or amorphous silicon.

5. The display panel according to claim 3, wherein each of first and second solar cell electrodes of the solar cell comprises at least one of nano-silver, graphene, carbon nanotubes, aluminium, cadmium, and copper.

6. A display device comprising the display panel according to claim 3.

* * * * *